US012149215B2

United States Patent
Miehle et al.

(10) Patent No.: US 12,149,215 B2
(45) Date of Patent: *Nov. 19, 2024

(54) AMPLIFIER WITH INTEGRATED GAIN SLOPE EQUALIZER

(71) Applicant: Viasat Inc., Carlsbad, CA (US)

(72) Inventors: Konrad Miehle, Queen Creek, AZ (US); Fonzie K. Sanders, Tarpon Springs, FL (US); Alberto Rodriguez, Land O Lakes, FL (US)

(73) Assignee: Viasat, Inc., Carlsbad, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/353,719

(22) Filed: Jul. 17, 2023

(65) Prior Publication Data
US 2023/0361728 A1    Nov. 9, 2023

Related U.S. Application Data

(63) Continuation of application No. 17/255,995, filed as application No. PCT/US2019/039428 on Jun. 27, 2019, now Pat. No. 11,750,154.

(60) Provisional application No. 62/690,447, filed on Jun. 27, 2018.

(51) Int. Cl.
| | |
|---|---|
| *H03F 9/00* | (2006.01) |
| *H03F 1/56* | (2006.01) |
| *H03F 3/195* | (2006.01) |

(52) U.S. Cl.
CPC .............. *H03F 3/195* (2013.01); *H03F 1/56* (2013.01); *H03F 2200/318* (2013.01); *H03F 2200/451* (2013.01); *H03F 2200/537* (2013.01)

(58) Field of Classification Search
CPC .................................... H03F 9/00; H03F 3/45
USPC ........................................ 330/165, 276, 252
See application file for complete search history.

(56) References Cited

U.S. PATENT DOCUMENTS

| | | | |
|---|---|---|---|
| 3,699,465 A | 10/1972 | Pranke | |
| 4,254,366 A | 3/1981 | Truskalo | |
| 4,965,527 A | 10/1990 | Clark et al. | |
| 5,128,683 A | 7/1992 | Freedman et al. | |
| 6,147,557 A | 11/2000 | Kakuta et al. | |

(Continued)

FOREIGN PATENT DOCUMENTS

WO    WO 2016/153459 A1    9/2016

OTHER PUBLICATIONS

International Search Report and Written Opinion—PCT/US2019/039428—ISA/EPO—Sep. 10, 2019.
Sanadgol et al. "60 GHz Substrate Integrated Waveguide Fed Steerable LTCC Antenna Array" IEEE, Jul. 2010, 4 pgs.
Maaskant et al., "Applying the Active Antenna Impedance to Achieve Noises Match in Receiving Array Antennas" IEEE 2007, 4 pages.

(Continued)

*Primary Examiner* — Henry Choe
(74) *Attorney, Agent, or Firm* — Holland & Hart LLP

(57) ABSTRACT

The present disclosure describes systems and devices for gain slope equalization in a radio frequency (RF) amplifier. The RF amplifier may include an input stage for receiving an RF signal. In conjunction with the input stage, the RF amplifier may incorporate an amplification stage to amplify the RF signal. Coupled with the amplification stage may be a transformer including a first winding to receive the amplified RF signal, a second winding providing an RF output signal, and a resonator including a third winding that is coupled to the first and second windings. The resonator may be coupled to a circuit network which may be tuned to affect the resonance frequency and the gain slope of the RF output signal.

27 Claims, 7 Drawing Sheets

(56) References Cited

U.S. PATENT DOCUMENTS

| | | | |
|---|---|---|---|
| 6,414,547 B1 | 7/2002 | Shkap | |
| 6,486,618 B1 | 11/2002 | Li | |
| 7,683,718 B2 | 3/2010 | Dishop | |
| 7,868,830 B2 | 1/2011 | Worl et al. | |
| 8,933,757 B2 * | 1/2015 | Shirinfar | H03B 5/1243 |
| | | | 331/49 |
| 9,379,438 B1 | 6/2016 | Runyon et al. | |
| 9,755,306 B1 | 9/2017 | Ogilvie | |
| 11,398,853 B2 | 7/2022 | Mishra et al. | |
| 11,513,251 B2 * | 11/2022 | Widmer | G01V 3/101 |
| 11,532,457 B2 | 12/2022 | Bowman | |
| 11,552,594 B2 * | 1/2023 | Broussev | H01F 21/12 |
| 11,789,174 B2 * | 10/2023 | Widmer | H02J 50/12 |
| | | | 324/200 |
| 11,815,644 B2 * | 11/2023 | Widmer | B60L 53/124 |
| 2008/0313696 A1 | 12/2008 | Blumenkranz | |
| 2009/0231076 A1 | 9/2009 | Lai | |
| 2010/0041361 A1 | 2/2010 | Ojo | |
| 2012/0075019 A1 | 3/2012 | Visser et al. | |
| 2012/0249105 A1 | 10/2012 | Nussbaum | |
| 2014/0320230 A1 | 10/2014 | Jooyaie et al. | |
| 2017/0170556 A1 | 6/2017 | Carey et al. | |
| 2023/0098175 A1 | 3/2023 | Weberg | |

OTHER PUBLICATIONS

Matsumoto et al., "3-6-3 Beam Forming Network", Journal of the National Institute of Information and Communications Technology, vol. 50. Nos. 3/4, 12 pgs.

Nikkhah et al., "Compact Low-Cost Phased Array of Dielectric Resonator Antenna Using Parasitic Elements and Capacitor Loading" IEEE 2011, 4 pgs.

Weem et al., "A Method for Determining Noise Coupling in a Phased Array Antenna", IEEE, 2001, 4 pgs.

Bregman "Minimum Receiver Noise in Phased Array Feeds and Aperture Arrays", Penn State, 2001 retrieved from http://citeseerx.ist.psu.edu/viewdoc/download?doi=10.1.1.612.2044&rep=rep1&type=pdf, 4 pages.

Itoh et al., "L-Band SiGe HBT Active Differential Equalizers Providing Variable Positive or Negative Gain Slopes", IEEE 2016, 4 pages.

Ahn et al., "A Fully Integrated Dual-Mode CMOS Power Amplifier With an Autotransformer-Based Parallel Combining Transformer" IEEE Microwave and Wireless Component Letters, vol. 27, No. 9, Sep. 2017, 3 pages.

Lin et al., A K-Band Transformer Based Power Amplifier With 34.4-dBm Output Power and 28% PAE in 90-nm CMOS Technology, IEEE 2017, 4 pages.

* cited by examiner

| | Primary |
|---|---|
| | Secondary |
| | Third |

AMPLIFIER WITH INTEGRATED GAIN SLOPE EQUALIZER

CROSS REFERENCE

The present application for patent is a continuation of U.S. patent application Ser. No. 17/255,995 by MIEHLE et al., entitled "AMPLIFIER WITH INTEGRATED GAIN SLOPE EQUALIZER," filed Dec. 23, 2020, which is a 371 national phase filing of International Patent Application No. PCT/US2019/039428 by MIEHLE et al., entitled "AMPLIFIER WITH INTEGRATED GAIN SLOPE EQUALIZER" filed Jun. 27, 2019, and to U.S. Provisional Patent Application No. 62/690,447 by MIEHLE et al., entitled "AMPLIFIER WITH INTEGRATED GAIN SLOPE EQUALIZER," filed Jun. 27, 2018, each of which are assigned to the assignee hereof, and each of which are expressly incorporated by reference in their entirety herein.

BACKGROUND

The present disclosure relates to communications systems, and more particularly to an amplifier with integrated gain slope equalizer.

A radio frequency (RF) communications system may feature several stages of components which may include components for amplification of a transmitted or received RF signal. However, some components may exhibit frequency-dependent characteristics. For example, a frequency response of an amplifier stage may exhibit a downslope in gain due to the frequency dependence of parasitic capacitances. To counteract this effect, equalization circuits may be introduced into the communications system in order to affect the frequency response of the amplifier stage(s). Current solutions that allow for programmability of slope control may introduce loss or impedance mismatch into the system in part due to their passive nature.

SUMMARY

The present disclosure provides techniques for an amplifier with integrated gain slope equalizer. The amplifier may include an input stage for receive an RF input signal, an amplification stage to amplify the RF input signal, and a transformer that performs output matching for the amplifier. The transformer may include a resonator which may be placed inside the transformer. The resonator may be paired with various circuit components to create a parallel resonance circuit, and may be programmed to provide varying levels of frequency response equalization at various frequencies of operation of the amplifier.

The foregoing has outlined rather broadly the features and technical advantages of examples according to the disclosure in order that the detailed description that follows may be better understood. Additional features and advantages will be described hereinafter. The conception and specific examples disclosed may be readily utilized as a basis for modifying or designing other structures for carrying out the same purposes of the present disclosure. Such equivalent constructions do not depart from the scope of the appended claims. Characteristics of the concepts disclosed herein, both their organization and method of operation, together with associated advantages will be better understood from the following description when considered in connection with the accompanying figures. Each of the figures is provided for the purpose of illustration and description only, and not as a definition of the limits of the claims.

BRIEF DESCRIPTION OF THE DRAWINGS

A further understanding of the nature and advantages of the present disclosure may be realized by reference to the following drawings. In the appended figures, similar components or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

An amplifier may be used to increase the amplitude of a signal applied to its input terminals, producing a greater amplitude signal at its output. The amount of amplification provided by an amplifier is measured by its gain, with an amplifier circuit having a power gain of greater than one. Amplifiers are widely used in almost all electronic equipment, including in equipment with RF applications. RF amplifiers often include design goals that include considerations for gain, power output, bandwidth, power efficiency, linearity (low signal compression at rated output), input and output impedance matching, and heat dissipation. RF amplifier design often includes trade-offs, for example, between efficiency and linearity with some designs being more efficient, but less linear.

Current RF amplifier designs may also include a trade-off between programmability of gain slope control and loss or impedance mismatch. The described features, however, may integrate a programmable gain slope equalizer with minimized loss. The described amplifier device may include an amplification stage that includes components to amplify an RF signal. The amplifier device may include an input stage that may perform input impedance matching, and may be integrated with the amplification stage, or include separate components. Coupled with the amplification stage may be a transformer including a first winding to receive the amplified RF signal, a second winding providing an RF output signal, and a resonator including a third winding that is coupled to the first and second windings. The resonator may be coupled to a circuit network which may be tuned to affect the resonance frequency and the gain of the RF output signal across a range of frequencies including the resonance frequency.

The following description provides examples, and is not limiting of the scope, applicability, or examples set forth in the claims. Changes may be made in the function and arrangement of elements discussed without departing from the scope of the disclosure. Various examples may omit, substitute, or add various procedures or components as appropriate. Also, features described with respect to some examples may be combined in other examples.

Figure 1:
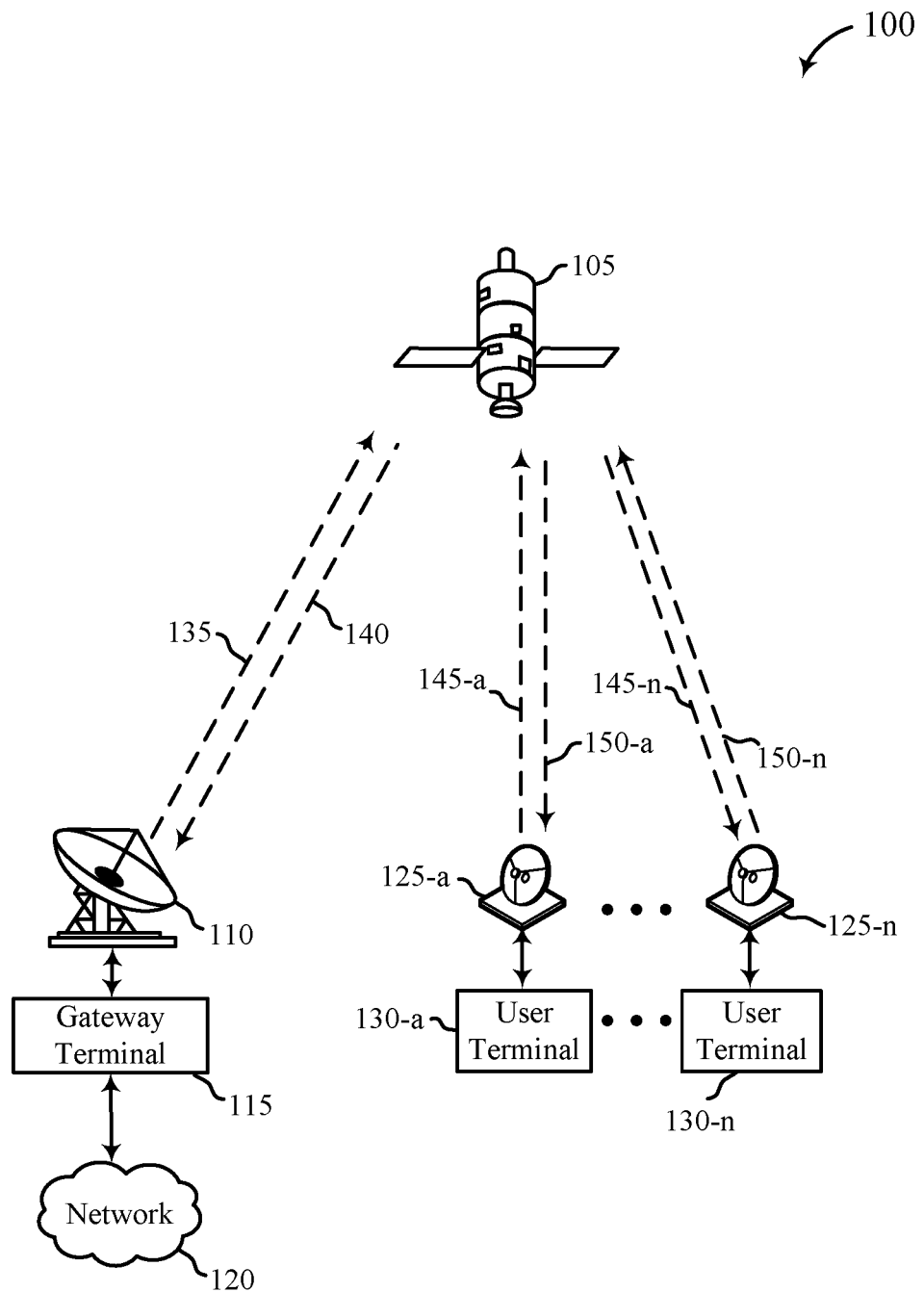
FIG. 1 is a diagram of an exemplary hub-spoke satellite communication system, in accordance with various aspects of the present disclosure.

FIG. 1 is a diagram of an exemplary hub-spoke satellite communication system 100 in accordance with various aspects of the present disclosure. The satellite communication system 100 includes a satellite 105 linking a gateway terminal 115 with one or more user terminals 130. The satellite communication system 100 may use a number of network architectures including space and ground segments. The space segment may include more than one satellite while the ground segment may include a large number of user terminals, gateway terminals, network operations centers (NOCs), satellite and gateway terminal command centers, and the like. These elements are not shown in the figure for clarity.

The gateway terminal 115 is sometimes referred to as a hub or ground station. The gateway terminal 115 may service forward uplink signals 135 to the satellite 105 and return downlink signals 140 from the satellite 105. The gateway terminal 115 may also schedule traffic to the user terminals 130. Alternatively, the scheduling may be performed in other parts of the satellite communication system 100 (e.g., at one or more NOCs and/or gateway command centers neither of which are shown in this example).

The gateway terminal 115 may also provide an interface between a network 120 and the satellite 105. The gateway terminal 115 may receive data and information from the network 120 that is directed to the user terminals 130. The gateway terminal 115 may format the data and information for delivery to the user terminals 130 via the satellite 105. The gateway terminal 115 may also receive signals carrying data and information from the satellite 105. This data and information may be from the user terminals 130 and directed to destinations accessible via the network 120. The gateway terminal 115 may format this data and information for delivery via the network 120.

The network 120 may be any type of network and may include, for example, the Internet, an IP network, an intranet, a wide-area network (WAN), a local-area network (LAN), a virtual private network (VPN), a public switched telephone network (PSTN), a public land mobile network, and the like. The network 120 may include both wired and wireless connections as well as optical links. The network 120 may connect the gateway terminal 115 with other gateway terminals that may be in communication with the satellite 105 or with other satellites.

The gateway terminal 115 may use one or more antennas 110 to transmit the forward uplink signals 135 to the satellite 105 and to receive the return downlink signals 140 from the satellite 105. The antenna 110 shown in FIG. 1 includes a reflector with high directivity in the direction of the satellite 105 and low directivity in other directions. The antenna 110 may be implemented in a variety of alternative configurations and include operating features such as high isolation between orthogonal polarizations, high efficiency in the operational frequency bands, low noise, and the like.

In some satellite communication systems there may be a limited frequency spectrum available for transmission. Forward uplink signals 135 and return downlink signals 140 may use the same, overlapping, or different frequencies compared to the return uplink signals 145 from the user terminals 130 to the satellite 105, and/or forward downlink signals 150 from the satellite 105 to the user terminals 130. In some examples, the gateway terminal 115 may be located away from the user terminals 130, which enables frequency re-use. In other examples, the user terminals 130 may be located near the gateway terminal 115.

The satellite 105 may be a geostationary satellite that is configured to receive and transmit signals. The satellite 105 may receive the forward uplink signals 135 from the gateway terminal 115 and transmit one or more corresponding forward downlink signals 150 to one or more user terminals 130. The satellite 105 may also receive one or more return uplink signals 145 from one or more user terminals 130 and transmit corresponding return downlink signals 140 to the gateway terminal 115.

The satellite communication system 100 may employ spot beam coverage areas with a high degree of frequency reuse. Satellite 105 may utilize a large number of small spot beams covering a large composite area. Each spot beam may carry one or more forward downlink signals 150, forward uplink signals 135, return uplink signals 145, or return downlink signals 140. The spot beams may allow for flexible and configurable allocation of bandwidth. In the example shown in FIG. 1, the gateway terminal 115 and the user terminals 130 may be within the same or different spot beams. Each spot beam may use a single carrier (i.e., one carrier frequency), a contiguous frequency range, or a number of frequency ranges.

The satellite communication system 100 may implement fixed spot beams using a fixed multi-beam antenna (MBA) and/or an active phased array antenna (APAA). The MBA may serve fixed beams, and the communications links may be switched over time in a pattern including combinations of forward uplink signals 135 and return uplink signals 145. The APAA may be used as a beam-hopping antenna. The APAA may provision communications between user terminals 130 using two independently steerable beams for each of the transmitting and receiving antennas. Beam steering is achieved by updating pointing directions via control of digital phase shifters in switching interval slots as short as 2 ms in Satellite Switched Time Division Multiple Access (SS-TDMA) mode, where the shortest beam dwell time corresponds to the slot time of the SS-TDMA system. Switching patterns for both the MBA and APAA may be uploaded from the gateway terminal 115.

A high-capacity architecture used in satellite communication system 100 may include small spot beams targeted at fixed locations. Each spot beam may use a large amount of spectrum, for example 250-1000 MHz. The resulting large capacity is a product of several characteristics of the satellite communication system 100, including, for example, (a) the large number of spot beams, typically 60 to 80 or more, (b) the high antenna directivity associated with the spot beams (resulting in, for example, advantageous link budgets), and (c) the relatively large amount of bandwidth used within each spot beam.

The forward downlink signals 150 may be transmitted from the satellite 105 to one or more of the user terminals 130. The user terminals 130 may receive the forward downlink signals 150 using antennas 125. In one example, an antenna and a user terminal together include a very small aperture terminal (VSAT) with the antenna measuring approximately 0.75 meters in diameter and having approximately 2 watts of power. In other examples, a variety of other types of antennas 125 may be used to receive the forward downlink signals 150 from the satellite 105. Each of the user terminals 130 may include a single user terminal or a hub or router coupled to other user terminals. Each of the user terminals 130 may be connected to various consumer premises equipment (CPE) such as computers, local area networks, internet appliances, wireless networks, and the like.

The user terminals 130 may transmit data and information to a destination accessible via the network 120. The user terminals 130 may transmit the return uplink signals 145 to the satellite 105 using the antennas 125. The user terminals 130 may transmit the signals according to a variety of physical layer transmission techniques including a variety of multiplexing schemes and/or modulation and coding schemes. For example, the user terminals 130 may use high speed signal switching for the return uplink signals 145. The switching patterns may support both MBA and APAA systems. When the user terminals 130 use high speed signal switching for the return uplink signals 145, each transmitted signal may be an example of a pulsed RF communication from the user terminal 130.

The user terminals 130 may operate at radio frequency (RF) bands such as Ka band frequencies. The amount of frequency resources and fraction of time a user terminal 130 transmits may determine the capacity of the user terminal 130. The capacity may be changed by changing the fraction of time used for transmissions. This may provide flexibility in allocating capacity between different user terminals both temporally and spatially (e.g., temporally by changing capacity allocation for a particular coverage area over time and spatially by changing capacity allocation for a particular spot beam coverage area over time).

The user terminals 130 may transmit based on a transmit signal switching pattern (e.g., a transmit switching sequence). The switching pattern may be a set of on/off periods versus time during a frame. The user terminals 130 may enable transmissions during the on periods, and may disable transmissions over the spot beam during the off periods. The switching pattern may be synchronized in time with a switching pattern of the satellite 105 or gateway terminal 115. The switching pattern may be stored in memory at the user terminals 130 and may be received from the satellite 105 using a downstream signal that may be either in-band or out-of-band with other downstream signals.

Various components of satellite communication system 100 may employ amplifiers that may operate across a broad frequency range. For example, transmission or reception of forward downlink signals 150, forward uplink signals 135, return uplink signals 145, or return downlink signals 140 may be performed using amplifiers included in user terminals 130, satellite 105, or gateway terminal 115. In some cases, the amplifiers may operate over a broad frequency range (e.g., greater than 1 MHz, 10 MHz, 100 MHz, or 1 GHz), where gain slope may negatively impact performance of the system. In some cases, multiple amplifiers are used in a chain (e.g., the output of a first amplifier stage feeding the input of a second amplifier stage). Gain slope may compound across amplifier stages, resulting in substantial gain slope or variation of gain slope. Use of separate equalization stages may introduce loss or impedance mismatch that may reduce the performance or efficiency of the amplifier chain. According to aspects of the present disclosure, an amplifier device may allow tuning of a gain slope using an integrated gain slope equalization circuit. The described amplifier device may include a multi-stage device which may incorporate an input stage to receive an RF signal. In conjunction with the input stage, the amplifier device may incorporate an amplification stage to amplify the RF signal. Coupled with the amplification stage may be a transformer including a first winding to receive the amplified RF signal, a second winding providing an RF output signal, and a resonator having a third winding that is coupled to the first and second windings. The resonator may be coupled to a circuit network which may be tuned to affect the resonance frequency and the gain of the RF output signal.

While the techniques for an amplifier with integrated gain slope equalizer are described with reference to the user terminals 130, satellite 105 or the gateway terminal 115 of satellite communication system 100, similar techniques may be employed in other communication systems (e.g., other RF systems).

Figure 2:
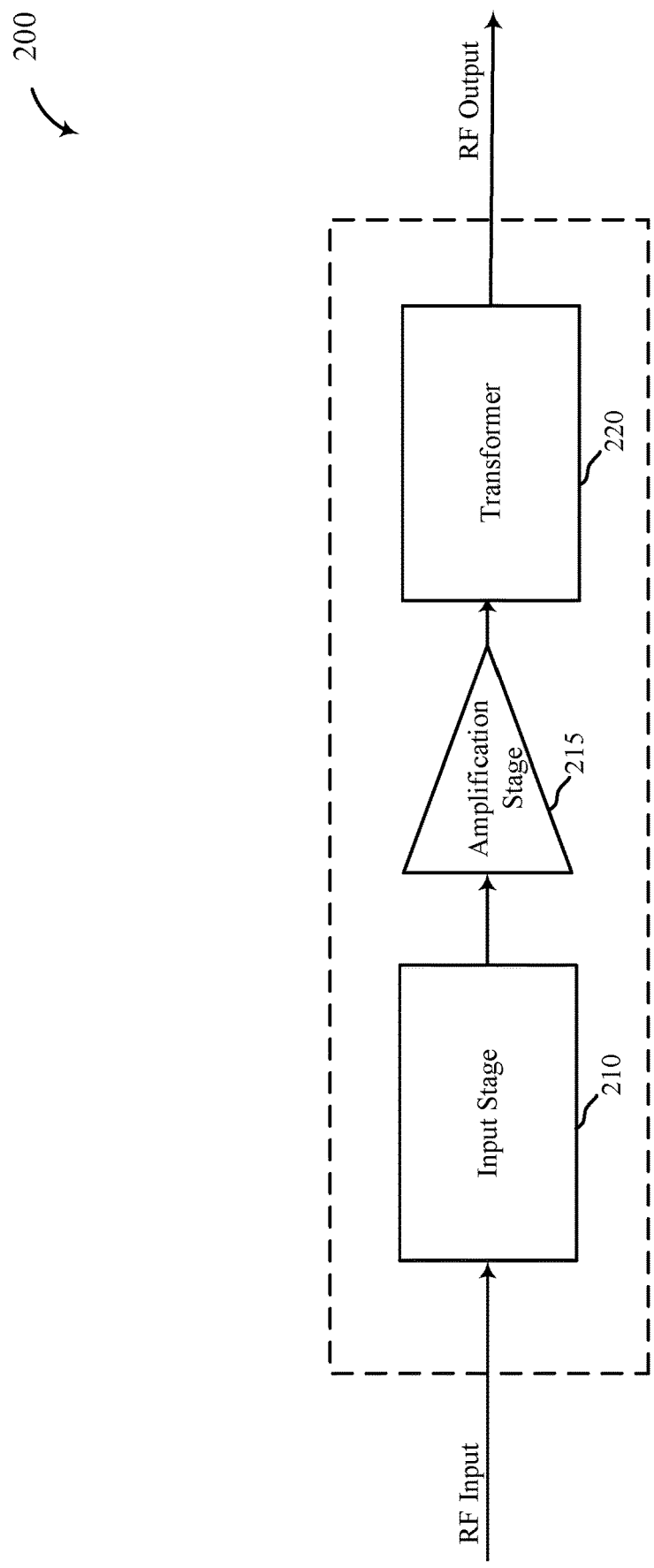
FIG. 2 is a block diagram of an exemplary amplifier device for a radio frequency (RF) communication device, in accordance with various aspects of the present disclosure.

FIG. 2 is a block diagram of an exemplary amplifier device 200 for a radio frequency (RF) communication device, in accordance with various aspects of the present disclosure. The amplifier device 200 may include an input stage 210, an amplification stage 215, and a transformer 220.

Input stage 210 may include various circuitry to process a receiver's antenna input. Input stage 210 may be impedance matched in order to ensure that maximum possible power is delivered. Amplification stage 215 may take the signal from input stage 210 and amplify (e.g., convert a low amplitude or low-power signal into a higher amplitude or higher power signal) the signal. The amplifier device 200 may include one or more amplifier stages, each including an input stage 210, an amplification stage 215, and a transformer 220. Thus, the amplifier device 200 may be or include one or more amplifiers, with multiple amplifiers connected either in parallel or cascaded. Implementing multiple amplifiers may provide a larger range of gain slope adjustability. Amplifier device 200 may include a biasing network in order to provide voltage to various components of the amplifier. Amplifier device 200 may be of varying amplifier class types. For example, amplifier device 200 may be a low noise amplifier or a high-power amplifier.

Transformer 220 may include a first winding to receive an amplified signal from amplification stage 215, a second winding to provide a differential RF output signal which may be based in part on the amplified signal from amplification stage 215, and a resonator. The resonator may include a third winding that is at least partially coupled to the first and second windings. In some examples, the resonator may be at least partially within a projection of the first and second windings. The resonator may take electromagnetic energy away from the main transformer windings (e.g., a parasitic coil), reducing signal transfer around its resonance frequency. The resonator may include one or more circuit networks including one or more capacitors (e.g., fixed capacitor(s), one switched capacitor(s)), and may include one or more resistors (e.g., fixed resistor(s), switched resistor(s)). The circuit networks allow for the tuning of the resonance frequency and/or quality factor of the resonator. For example, the resonance frequency can be tuned below or above the frequency band of interest creating an up or down slope in the amplifier transfer function. The quality factor of the resonator may be tuned to provide a sharper or broader effect of the resonator to the frequency-dependent profile of the amplifier device 200.

Figure 3:
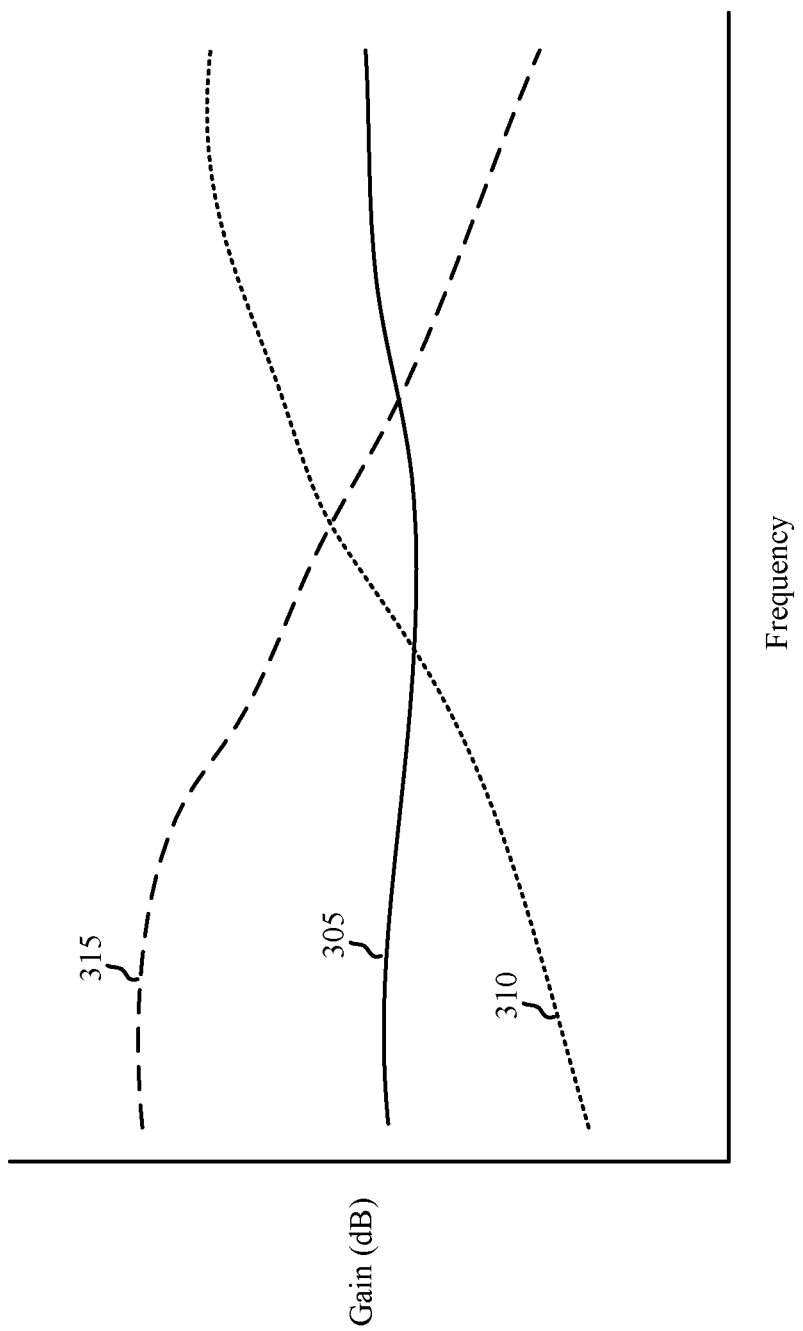
FIG. 3 is a diagram of a frequency domain representation of amplifier characteristics, in accordance with various aspects of the present disclosure.

FIG. 3 is a diagram of a frequency domain representation 300 of amplifier characteristics, in accordance with various aspects of the present disclosure. Frequency domain representation 300 may show the gain of amplifier device 200 or 600 for three different cases. Frequency-dependent profile 305 may illustrate the gain without slope compensation where the resonance frequency is tuned to the center of the frequency band of operation. Although frequency-dependent profile 305 is illustrated as relative flat over a region of interest, some amplifier devices may have a different intrinsic frequency response (e.g., downslope). Frequency-dependent profile 310 may illustrate the gain with a positive slope (e.g., increasing gain at higher frequencies) and frequency-dependent profile 315 may illustrate the gain with a negative slope (e.g., decreasing gain at higher frequencies).

The variable capacitance value of a circuit network connected to the third winding of the resonator may allow tuning of the resonance frequency. The value of the capacitance may be varied by utilizing one or more switchable capacitors or variable capacitors (e.g., varactors). In some examples, increasing the capacitance of the circuit network may allow for the resonance to be lower in frequency. Frequency-dependent profile 310 may illustrate an example of increased capacitance resulting in the resonance to be lower in frequency. In some examples, decreasing the capacitance of the circuit network may allow for the resonance to be higher in frequency. Frequency-dependent profile 315 may illustrate an example of decreased capacitance resulting in the resonance to be higher in frequency. In some examples, the gain slope of the amplifier device 200 may be tuned to have a slope (e.g., frequency-dependent profile 310) that compensates for a slope (e.g., down slope) in a different amplifier stage of an amplifier chain, resulting in a relatively flat or desired gain slope response.

Figure 4:
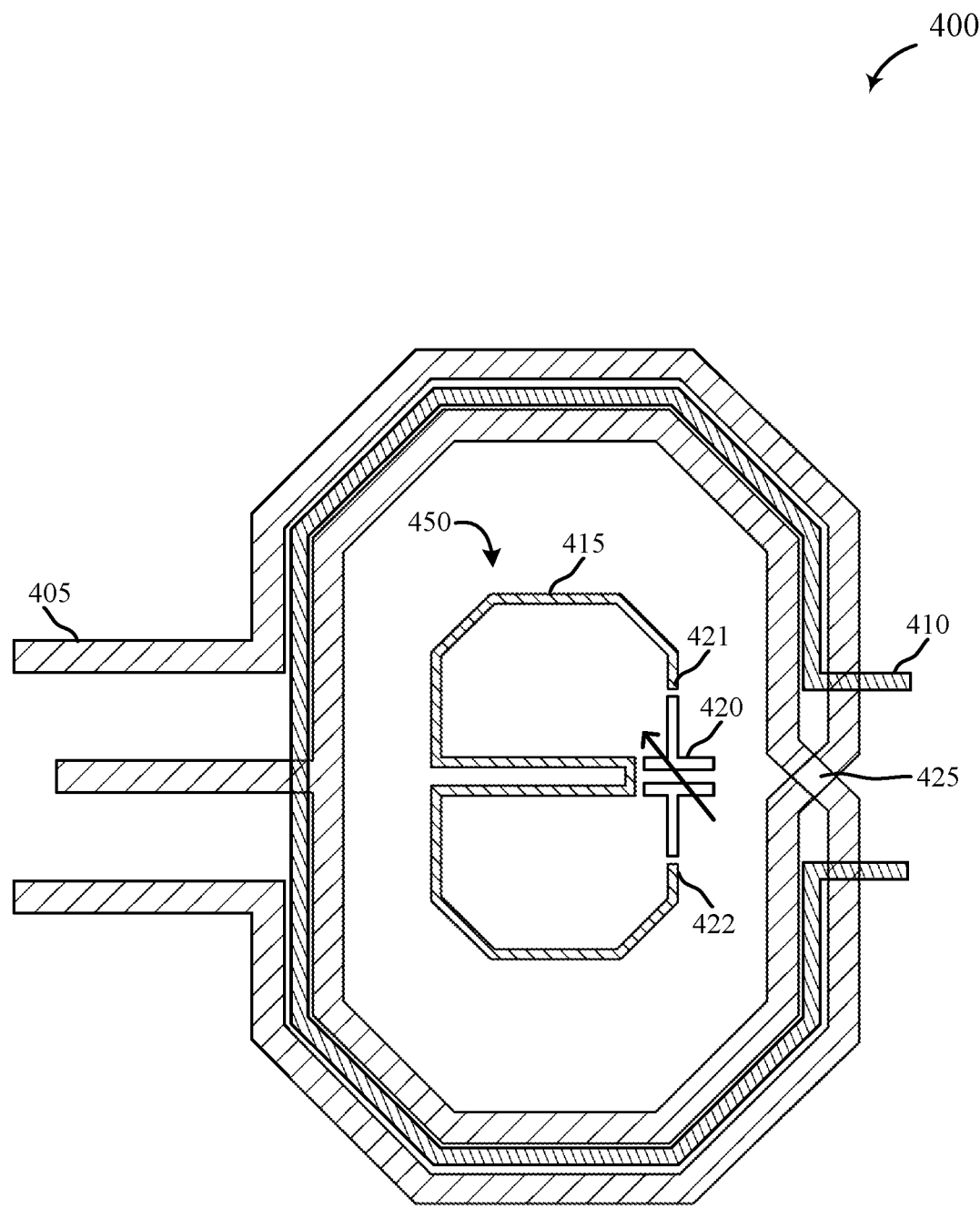
FIG. 4 is a diagram of an exemplary transformer for a RF communication device, in accordance with various aspects of the present disclosure.
Figure 4:
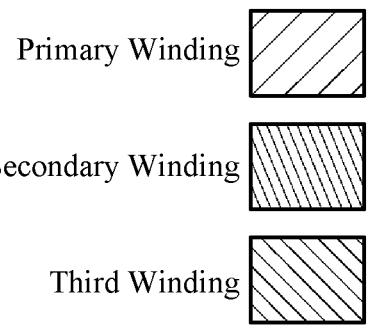

FIG. 4 is a diagram of an exemplary transformer 400 for a RF communication device, in accordance with various aspects of the present disclosure. The transformer 400 may include a primary winding 405, a secondary winding 410, and a resonator 450. Resonator 450 may include a third winding 415 and a circuit network 420.

Primary winding 405 may receive an input signal from a source. The source may be an amplified signal from an amplification stage 215 as described with reference to FIG. 2. Secondary winding 410 may provide an output signal based at least in part on the input signal received by primary winding 405. Primary winding 405 and secondary winding 410 may be coils of conductive material (e.g., aluminum, copper, polysilicon) and may be coupled magnetically. Primary winding 405 may convert the input signal into a magnetic field and secondary winding 410 may convert flux of the magnetic field into electrical power producing an output signal. Transformer 400 may operate to either increase or decrease the voltage applied to primary winding 405 based on a number of coil turns in primary winding 405 compared to the number of coil turns on secondary winding 410 (i.e., turns ratio).

A projection of primary winding 405 may be at least partially coincident with a projection of secondary winding 410. A projection of a winding may be, for example, a projection of an area in a plane encompassed by the winding in directions perpendicular to the plane. In some examples such as transformer 400, the projection of secondary winding 410 may be entirely (e.g., or almost entirely) within the projection of primary winding 405. In some examples, a centroid of primary winding 405 may be coincident with a centroid of secondary winding 410.

Third winding 415 may be at least partially coupled (e.g., magnetically) to primary winding 405 and secondary winding 410. A projection of third winding 415 may be at least partially within a projection of both primary winding 405 and secondary winding 410. In some examples such as transformer 400, third winding 415 may be entirely within a projection of both primary winding 405 and secondary winding 410. In some examples, a centroid of third winding 415 may be coincident with at least one of a centroid of primary winding 405 or a centroid of secondary winding 410. In some examples such as transformer 400, a centroid of third winding 415 may be coincident with both the centroid of primary winding 405 and the centroid of secondary winding 410.

Third winding 415 may act as a parasitic coil and take electromagnetic energy away from transformer 400 at or around a specific frequency. Third winding 415 may provide a differential output voltage to circuit network 420 via a first terminal 421 and second terminal 422. Although circuit network 420 is illustrated as a variable capacitor, circuit network 420 may include various other circuit elements. One or more circuit elements of circuit network 420 may be at least partially within a projection of both primary winding 405 and secondary winding 410. In some examples such as transformer 400, circuit network 420 may be entirely within a projection of both primary winding 405 and secondary winding 410. In some examples, one or more circuit elements of circuit network 420 may be entirely surrounded by the projection of both primary winding 405 and secondary winding 410. In some examples such as transformer 400, circuit network 420 may be entirely surrounded by the projection of both primary winding 405 and secondary winding 410.

Transformer 400 may be implemented within an integrated circuit (IC) having multiple conductor layers. Each conductor layer may be formed by IC processing techniques such as deposition, etching, and the like. Each of primary winding 405, secondary winding 410, and third winding 415 may be composed of traces on one or more conductor layers of the IC, which may be separated by insulating or dielectric layers (e.g., silicon dioxide, high-k or low-k dielectric layers). For example, primary winding 405 may be integrated on a first conductor layer of the IC. Although illustrated as having one section of the conductor layer traverse over another section of the conductor layer at crossover point 425, primary winding 405 may include a segment of a different conductor layer at crossover point 425, as would be understood by one of skill in the art. Secondary winding 410 may be integrated on the first or a second conductor layer of the IC, and third winding 415 may be integrated on the first, the second, or a third conductor layer of the IC. Third winding 415 may be offset from primary winding 405 or secondary winding 410 along a dimension that is perpendicular to a plane of primary winding 405 or secondary winding 410. For example, the third winding 415 may be on a different conductor layer than the primary winding 405 or the secondary winding 410. In some examples, each of the primary winding 405, secondary winding 410, and third winding 415 are on different conductor layers.

Transformer 400 may include magnetic materials in the transformer core, or may not include magnetic materials in the transformer core. For example, if implemented on an IC, primary winding 405, secondary winding 410, and third winding 415 may be implemented on IC conductor layers, with dielectric materials making up the interior of the windings on each layer. In some cases, magnetic materials may be added above or below the IC conductor layers within or proximate to the projections of the windings in an IC post-processing step. Where magnetic materials are not added, transformer 400 may be considered to be an air core transformer, which may have air or other non-magnetic materials within or in proximity to the area or projection of the primary winding 405, secondary winding 410, or third winding 415.

Figure 5:
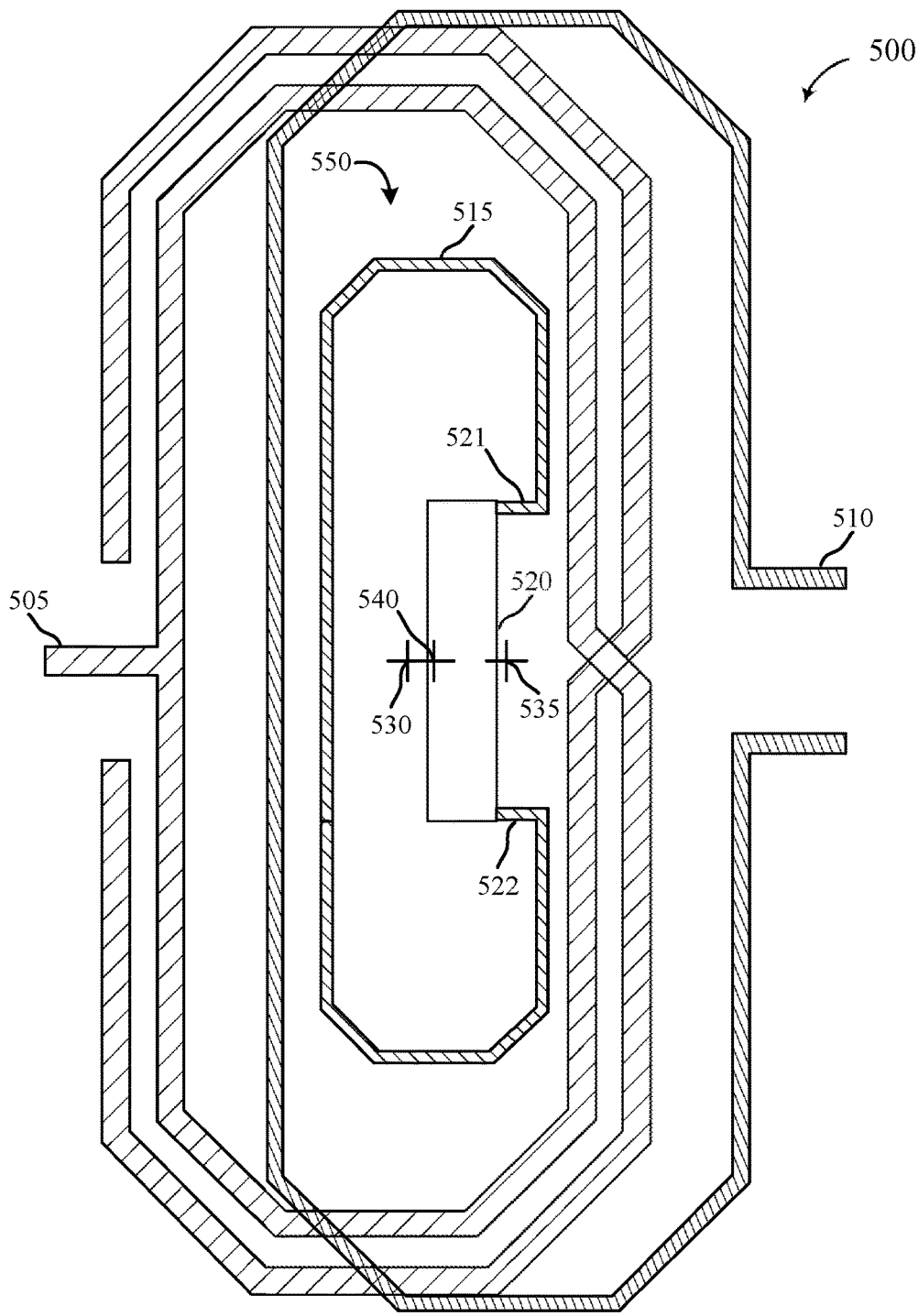
FIG. 5 is a diagram of an exemplary transformer for a RF communication device, in accordance with various aspects of the present disclosure.

FIG. 5 is a diagram of an exemplary transformer 500 for a RF communication device, in accordance with various aspects of the present disclosure. The transformer 500 may include a primary winding 505, a secondary winding 510, and a resonator 550. Resonator 550 may include a third winding 515 and a circuit network 520.

Transformer 500 may be composed either of magnetic materials or non-magnetic materials. Transformer 500 may be similar to transformer 400 in that primary winding 505 may be at least partially coincident with secondary winding 510. However, in some examples such as transformer 500, a projection of secondary winding 510 is not entirely within a projection of primary winding 505. In some examples such as transformer 500, a centroid 530 of primary winding 505 may be offset from a centroid 535 of secondary winding 510. A lowered coupling factor between primary winding 505 and secondary winding 510 may affect the bandwidth of the resonance frequency output from transformer 500. In some examples, primary winding 505 and secondary winding 510 may be portions of two coupled resonators (e.g., with other components not shown), with the resonator 550 serving as a third coupled resonator.

Third winding 515 may be at least partially magnetically coupled to primary winding 505 and secondary winding 510. Third winding 515 may be at least partially within a projection of both primary winding 505 and secondary winding 510. In some examples, a centroid 540 of third winding 515 may be offset from at least one of the centroid 530 of primary winding 505 or the centroid 535 of secondary winding 510. In some examples, the offset of the centroid 540 of third winding 515 from the centroid 530 of primary winding 505 and from the centroid 535 of secondary winding 510 may be symmetrical. Third winding 515 may be offset from primary winding 505 or secondary winding 510 along a dimension that is perpendicular to a plane of primary winding 505 or secondary winding 510. For example, third winding 515 may be on a different conductor layer, or otherwise offset into or out of the page as illustrated in FIG. 5.

Third winding 515 may provide a differential output voltage to circuit network 520 via a first terminal 521 and second terminal 522. One or more circuit elements of circuit network 520 may be at least partially within a projection of either primary winding 505 or secondary winding 510. In some examples, one or more circuit elements of circuit network 520 may be either partially or entirely surrounded by the projection of either primary winding 505 or secondary winding 510. Control signaling for circuit network 520 is not shown in FIG. 5 for the sake of clarity, but as would be understood may cross into the projection of primary winding 505, secondary winding 510, or third winding 515.

Figure 6:
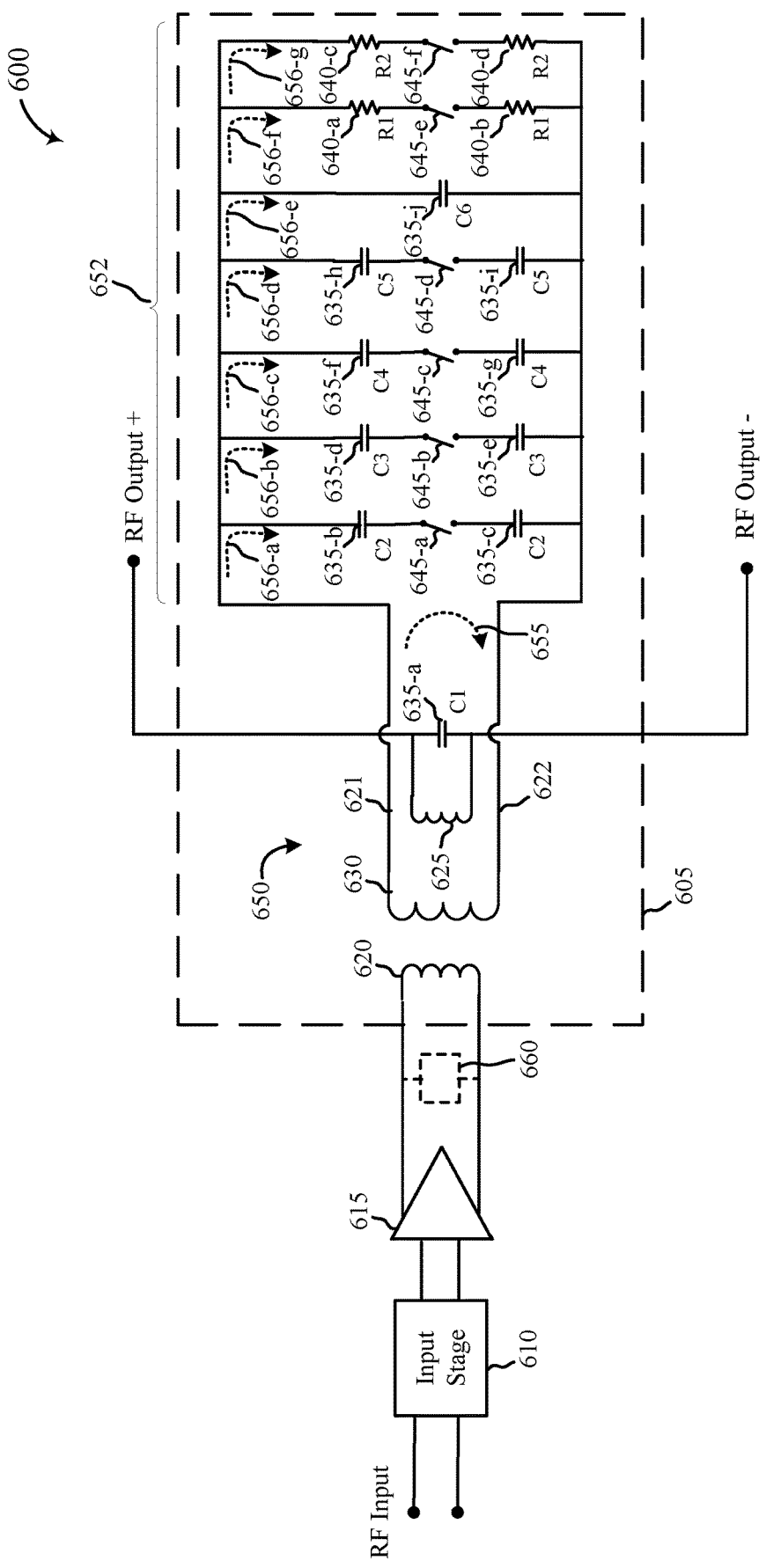
FIG. 6 is a block diagram of an exemplary amplifier device for a RF communication device, in accordance with various aspects of the present disclosure.

FIG. 6 is a block diagram of an exemplary amplifier device 600 for a RF communication device, in accordance with various aspects of the present disclosure. Amplifier device 600 may include a transformer 605, an input stage 610, and an amplification stage 615.

Input stage 610 may include various circuits or elements to match impedance between an input of the amplifier device 600 and a driving circuit or antenna. Impedance matching of input stage 610 may ensure that power loss from driving circuits or antennas are minimized Amplification stage 615 may take the signal from input stage 610 and increase the power of the signal using various circuit elements (e.g., transistors, capacitors, resistors, current sources).

Transformer 605 may include first winding 620 to receive an amplified signal from amplification stage 615, second winding 625 to provide a differential RF output signal which may be based in part on the amplified signal from amplification stage 615, and a resonator 650. Resonator 650 may include a third winding 630 and a circuit network 652. Second winding 625 may be coupled to capacitor 635-$a$ which may serve to resonate the imaginary portion of the differential RF output impedance. More generally, the second winding 625 may include one or more parallel fixed or switchable branches, for example such as those discussed below with respect to circuit network 652 and/or circuit network 660.

Third winding 630 may be coupled to a circuit network 652 that may have an adjustable impedance along signal path 655 between a first terminal 621 and a second terminal 622 of the third winding 630. Circuit network 652 may include capacitors 635, resistors 640, and switches 645 coupled with the first terminal 621 and the second terminal 622, and the open or closed arrangement of switches 645 may establish the adjustable impedance of signal path 655. That is, the switches 645 may selectively form the signal path 655 from one or more signal paths 656 associated with the closed switches, and the capacitors 635 and/or resistors for the selected signal paths 656 associated with the closed switches 645 may establish the adjustable impedance of signal path 655. The circuit network 652 may be reconfigurable among a plurality of states based on switchable circuit elements (e.g., switches 645). Each of the plurality of states may provide for a different frequency response and gain slope of the differential RF output signal.

The circuit network 652 may have a parallel branch with a fixed impedance (e.g., signal path 656-$e$). For example, third winding 630 may be coupled to a fixed capacitor 635-$j$ of circuit network 652. Additionally or alternatively, circuit network 652 may include one or more switched parallel branches, each of which may be switched on or off by a respective switch 645. For example, a first parallel branch (e.g., signal path 656-$a$) may be enabled by switch 645-$a$ and include capacitor 635-$b$ and capacitor 635-$c$. Switch 645-$a$ may be placed in between capacitor 635-$b$ and capacitor 635-$c$ to minimize voltage swing effects (e.g., reduce voltage seen at the terminals of switch 645-$a$, minimize the effect of switch 645-$a$ on the impedance of the parallel branch). The values of capacitor 635-$b$ and capacitor 635-$c$ may be the same or different. Each parallel branch may be independently turned on or off. For example, circuit network 652 may include a second parallel branch (e.g., signal path 656-$b$) enabled by switch 645-$b$ including capacitor 635-$d$ and capacitor 635-$e$, a third parallel branch (e.g., signal path 656-$c$) enabled by switch 645-$c$ including capacitor 635-$f$ and capacitor 635-$g$, and a fourth parallel branch (e.g., signal path 656-$d$) enabled by switch 645-$d$ including capacitor 635-$h$ and capacitor 635-$i$. There may be more or fewer parallel branches of capacitors than those illustrated in FIG. 6. Switching on or off parallel branches of capacitors may affect a frequency response of the differential RF output signal.

Circuit network 652 may be reconfigurable among a plurality of states based on switchable circuit elements (e.g., switches 645). Circuit network 652 may include one or more fixed or switchable parallel branches of resistors 640 where the switchable parallel branches of resistors 640 may adjust an impedance of circuit network 652 along signal paths based on whether a switchable branch of resistors is configured in an open or closed arrangement. For example, a first parallel branch (e.g., signal path 656-$f$) may be enabled by switch 645-*e* and include resistor 640-*a* and resistor 640-*b*. Resistor 640-*a* and resistor 640-*b* may be separated by switch 645. The values of resistor 640-*a* and resistor 640-*b* may be the same or different. Circuit network 652 may include a second parallel branch (e.g., signal path 656-*g*) enabled by switch 645-*f* and including resistor 640-*c* and resistor 640-*d*. There may be more or fewer parallel branches of resistors than those illustrated in FIG. 6. The impedance of circuit network 652 may be adjusted based on one or more of the parallel branches of resistors being switched on or off. Adjusting the impedance of circuit network 652 may affect a quality factor of the resonator 650 including the third winding 630 and circuit network 652. In the illustrated example of FIG. 6, the components of the circuit network 652 are all arranged in separate parallel branches. In other implementations, the circuit network 652 may include one or more components in series with the parallel branches.

In some cases, amplifier device 600 may include a second circuit network 660 coupled between first and second terminals of first winding 620. The second circuit network 660 may include one or more parallel fixed or switchable branches. In some implementations, the second circuit network 660 may also include one or more components in series with the parallel branches. In implementations in which the second circuit network 660 includes one or more switchable branches it may be reconfigurable among a plurality of states based on switchable circuit elements (e.g., switches). In such a case, the second circuit network 660 may allow tuning of the transformer to have additional positive or negative gain slope, which may be used in conjunction with the circuit network 652 to achieve a desired gain slope across a frequency range of interest. In other implementations, the second circuit network 660 may only contain one or more parallel fixed branches.

Although FIG. 6 illustrates only one amplifier device 600, in some examples, one or more additional amplifier devices may be coupled to amplifier device 600 to add additional amplifier stages. Additional amplifier stages may emulate the design of amplifier device 600.

Figure 7:
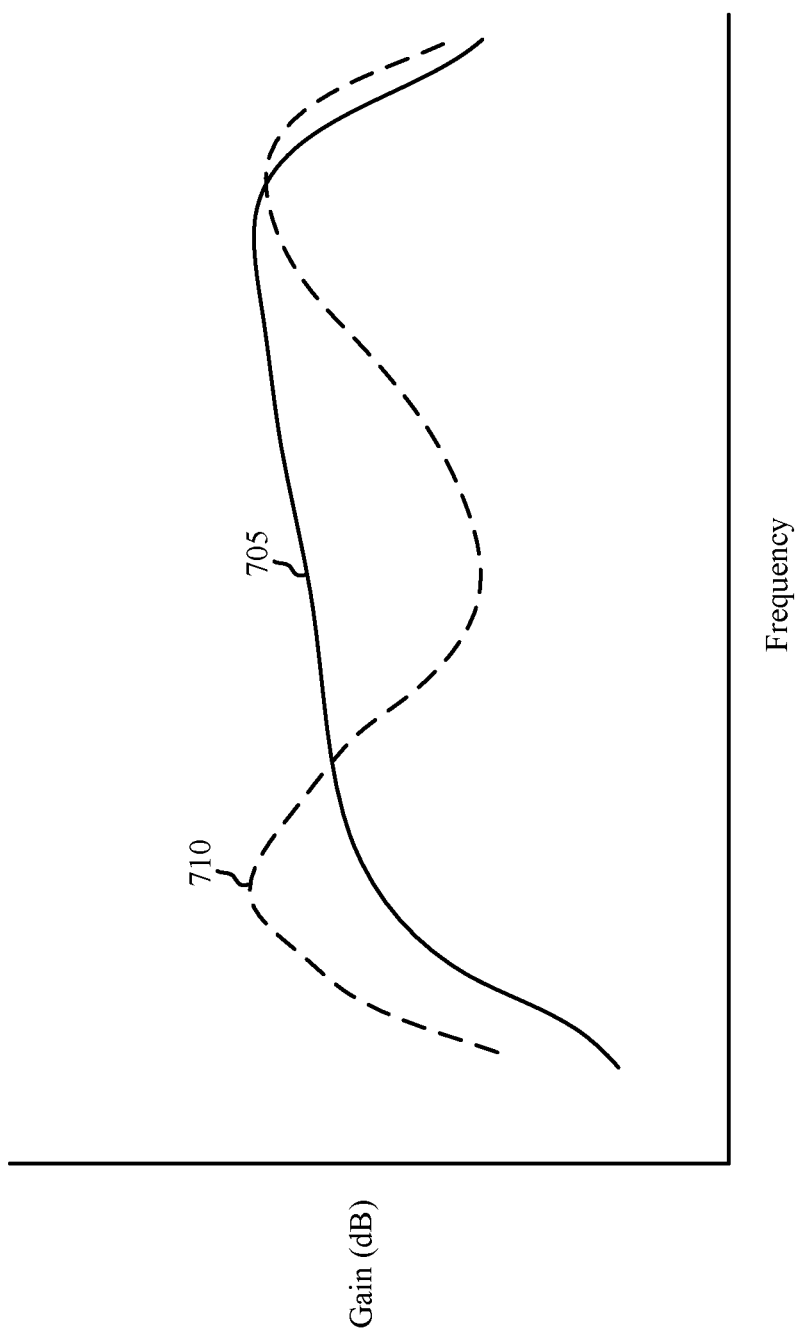
FIG. 7 is diagram of a frequency domain representation of various RF outputs, in accordance with various aspects of the present disclosure.

FIG. 7 is a frequency domain representation 700 of various RF outputs, in accordance with various aspects of the present disclosure. Frequency domain representation 700 may show the gain of amplifier device 200 or 600 for two different cases. Frequency-dependent profile 705 may illustrate the gain over a given frequency range where the resonance frequency of the resonator is tuned to the center of the frequency band of operation and the resonator has a first quality factor. Frequency-dependent profile 710 may illustrate the gain as a quality factor of the resonator is adjusted (e.g., increased).

The variable resistance value of a circuit network connected to the third winding of the resonator may adjust a quality factor of the circuit network which may in turn affect the value of the gain slope. For example, a higher quality factor will divert more energy from the RF output signal at the resonance frequency, which may result in a sharper notch in the gain slope curve. That is, adjusting the quality factor of the circuit network may change the depth of the notch of frequency-dependent profile 710. By adjusting the resonance frequency and the quality factor, the gain slope curve may be adjusted to achieve a desired slope and shape.

The detailed description set forth above in connection with the appended drawings describes examples and does not represent the only examples that may be implemented or that are within the scope of the claims. The terms "example" and "exemplary," when used in this description, mean "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and apparatuses are shown in block diagram form in order to avoid obscuring the concepts of the described examples.

Information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

As used in the present disclosure, the term "coincident" when used to describe a geometric relationship, is not intended to suggest a limitation to precise geometric coincidence. For instance, the term "coincident" is intended to include typical deviations from geometric coincidence relating to such considerations as, for example, manufacturing and assembly tolerances.

As used herein, the terms "magnetically coupled" or "coupled magnetically" refer to components where a primary coupling mode may be magnetic. It should be understood that components that are magnetically coupled may have other types of coupling such as capacitive coupling present (e.g., between the windings of a transformer) although considered to be parasitic in nature.

The various illustrative blocks and components described in connection with the disclosure herein may be implemented or performed with a general-purpose processor, a digital signal processor (DSP), an ASIC, an FPGA or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, multiple microprocessors, one or more microprocessors in conjunction with a DSP core, or any other such configuration.

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope and spirit of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. As used herein, including in the claims, the term "and/or," when used in a list of two or more items, means that any one of the listed items can be employed by itself, or any combination of two or more of the listed items can be employed. For example, if a composition is described as containing components A, B, and/or C, the composition can contain A alone; B alone; C alone; A and B in combination; A and C in combination; B and C in combination; or A, B, and C in combination. Also, as used herein, including in the claims, "or" as used in a list of items (for example, a list of items prefaced by a phrase such as "at least one of" or "one or more of") indicates a disjunctive list such that, for example, a list of "at least one of A, B, or C" means A or B or C or AB or AC or BC or ABC (i.e., A and B and C).

Computer-readable media includes both computer storage media and communication media including any medium that facilitates transfer of a computer program from one place to another. A storage medium may be any available medium that can be accessed by a general purpose or special purpose computer. By way of example, and not limitation, computer-readable media can comprise RAM, ROM, EEPROM, flash memory, CD-ROM or other optical disk storage, magnetic disk storage or other magnetic storage devices, or any other medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, include compact disc (CD), laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The previous description of the disclosure is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not to be limited to the examples and designs described herein but is to be accorded the broadest scope consistent with the principles and novel features disclosed herein.

What is claimed is:

1. A radio frequency (RF) amplifier device comprising:
    one or more RF components configured to generate an amplified RF signal based at least in part on an RF input signal, wherein the one or more RF components have a first frequency-dependent profile; and
    a transformer comprising:
        a first winding configured to receive the amplified RF signal;
        a second winding configured to provide an RF output signal based at least in part on the amplified RF signal; and
        a resonator comprising:
            a third winding at least partially coupled to the first winding and the second winding; and
            a circuit network configured to tune a resonance frequency of the resonator to provide a second frequency-dependent profile for the transformer, wherein the second frequency-dependent profile compensates for the first frequency-dependent profile.

2. The RF amplifier device of claim 1, wherein the one or more RF components comprise one or more amplifiers.

3. The RF amplifier device of claim 2, wherein the one or more amplifiers comprise a plurality of amplifiers connected in parallel.

4. The RF amplifier device of claim 2, wherein the one or more amplifiers comprise a plurality of cascaded amplifiers.

5. The RF amplifier device of claim 1, wherein the second frequency-dependent profile has a same magnitude and opposite polarity as the first frequency-dependent profile.

6. The RF amplifier device of claim 1, wherein the circuit network is coupled with the third winding.

7. The RF amplifier device of claim 1, wherein the circuit network is reconfigurable among a plurality of states.

8. The RF amplifier device of claim 7, wherein the circuit network is configured such that each of the plurality of states establishes a respective frequency-dependent profile of the RF amplifier device.

9. The RF amplifier device of claim 1, wherein the circuit network comprises:
    one or more circuit elements coupled between first and second terminals of the third winding.

10. The RF amplifier device of claim 9, wherein the one or more circuit elements comprise a circuit element along a signal path between the first and second terminals.

11. The RF amplifier device of claim 10, wherein the circuit network has an adjustable impedance along the signal path, and wherein the one or more circuit elements further comprise a switch along the signal path, and the adjustable impedance is due at least in part on whether the switch is configured in an open or closed arrangement.

12. The RF amplifier device of claim 1, wherein one or more circuit elements of the circuit network are within a projection of the first winding and the second winding.

13. The RF amplifier device of claim 1, wherein the one or more RF components are a first set of RF components, and wherein the RF amplifier device further comprises:
    a second set of one or more RF components configured to generate a second amplified RF signal based at least in part on the RF output signal, wherein the second set of RF components have a third frequency-dependent profile; and
    a second transformer comprising:
        a fourth winding configured to receive the second amplified RF signal;
        a fifth winding configured to provide a second RF output signal based at least in part on the second amplified RF signal; and
        a second resonator comprising:
            a sixth winding at least partially coupled to the fourth winding and the fifth winding; and
            a second circuit network configured to tune a second resonance frequency of the second resonator to provide a fourth frequency-dependent profile for the transformer that compensates for the third frequency-dependent profile.

14. A device comprising:
    a transformer comprising:
        a first winding configured to receive an amplified radio frequency (RF) signal from an amplification stage having a first frequency-dependent profile;
        a second winding configured to provide an RF output signal based at least in part on the amplified RF signal; and
        a resonator comprising:
            a third winding at least partially coupled to the first winding and the second winding; and
            a circuit network configured to tune a resonance frequency of the resonator to provide a second frequency-dependent profile for the transformer, wherein the second frequency-dependent profile compensates for the first frequency-dependent profile.

15. The device of claim 14, wherein the second frequency-dependent profile has a same magnitude and opposite polarity as the first frequency-dependent profile.

16. The device of claim 14, wherein the circuit network is coupled with the third winding.

17. The device of claim 14, wherein the circuit network is reconfigurable among a plurality of states.

18. The device of claim 14, wherein the circuit network comprises:
one or more circuit elements coupled between first and second terminals of the third winding.

19. The device of claim 18, wherein the one or more circuit elements comprise a circuit element along a signal path between the first and second terminals.

20. The device of claim 19, wherein the circuit network has an adjustable impedance along the signal path, and wherein the one or more circuit elements further comprise a switch along the signal path, and the adjustable impedance is due at least in part on whether the switch is configured in an open or closed arrangement.

21. The device of claim 14, wherein one or more circuit elements of the circuit network are within a projection of the first winding and the second winding.

22. A method comprising:
receiving a radio frequency (RF) input signal at an input stage of an RF amplifier device;
generating an amplified RF signal at an amplification stage based at least in part on the RF input signal, the amplification stage having a first frequency-dependent profile;
receiving the amplified RF signal at a first winding of a transformer;
providing, by a second winding of the transformer, an RF output signal based at least in part on the amplified RF signal; and
tuning a resonance frequency of a resonator to provide a second frequency-dependent profile for the transformer that compensates for the first frequency-dependent profile, the resonator having a third winding at least partially coupled to the first winding and the second winding.

23. The method of claim 22, wherein:
the first frequency-dependent profile has a first slope; and
the second frequency-dependent profile has a second slope that is an inverse of the first slope.

24. The method of claim 22, wherein tuning the resonance frequency is performed at a circuit network coupled with the third winding.

25. The method of claim 24, wherein tuning the resonance frequency of the resonator comprises setting a state of the circuit network to provide a desired frequency response and frequency-dependent profile of the RF output signal.

26. The method of claim 24, wherein tuning the resonance frequency of the resonator comprises switching on or off parallel branches of capacitors of the circuit network.

27. The method of claim 22, wherein the input stage, the amplification stage, and the transformer are components of a first amplifier stage, the method further comprising:
receiving the RF output signal from the first amplifier stage at a second input stage of a second amplifier stage;
generating a second amplified RF signal at a second amplification stage of the second amplifier stage based at least in part on the RF output signal, the second amplification stage having a third frequency-dependent profile;
receiving the second amplified RF signal at a fourth winding of a second transformer of the second amplifier stage;
providing, by a fifth winding of the second transformer of the second amplifier stage, a second RF output signal based at least in part on the second amplified RF signal; and
tuning a second resonance frequency of a second resonator having a sixth winding at least partially coupled to the fourth winding and the fifth winding, to provide a fourth frequency-dependent profile for the transformer that compensates for the first frequency-dependent profile of the first amplification stage.

* * * * *